United States Patent
Lee et al.

(10) Patent No.: US 10,867,851 B2
(45) Date of Patent: Dec. 15, 2020

(54) CONTACT STRUCTURE AND SEMICONDUCTOR DEVICE AND METHOD OF FORMING THE SAME

(71) Applicant: Taiwan Semiconductor Manufacturing Co., Ltd., Hsinchu (TW)

(72) Inventors: Ying Lee, Taichung (TW); Hsien-Ming Tai, Hsinchu (TW); Jian-Ming Huang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/905,765

(22) Filed: Feb. 26, 2018

(65) Prior Publication Data
US 2019/0267284 A1  Aug. 29, 2019

(51) Int. Cl.
*H01L 21/768* (2006.01)
*H01L 23/532* (2006.01)

(52) U.S. Cl.
CPC .... *H01L 21/76879* (2013.01); *H01L 21/7684* (2013.01); *H01L 21/76846* (2013.01); *H01L 21/76847* (2013.01); *H01L 23/53209* (2013.01); *H01L 23/53238* (2013.01); *H01L 23/53266* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,193,126 B2 * | 1/2019 | Oda ........................ H01M 2/30 |
| 2005/0032312 A1* | 2/2005 | Ebina ................... H01L 27/105 438/257 |
| 2005/0196954 A1* | 9/2005 | Noguchi ........... H01L 21/02074 438/622 |
| 2016/0181520 A1* | 6/2016 | Park ........................ H01L 43/02 711/118 |

* cited by examiner

*Primary Examiner* — Long Pham
(74) *Attorney, Agent, or Firm* — JCIPRNET

(57) ABSTRACT

A contact structure and semiconductor device and method of forming the same are disclosed. The contact structure includes a first metal layer and a second metal layer. The first metal layer is disposed in a first dielectric layer. The second metal layer is disposed in a second dielectric layer and extended into the first dielectric layer to electrically connect the first metal layer, wherein the first metal layer and the second metal layer include different metals.

20 Claims, 6 Drawing Sheets

CONTACT STRUCTURE AND SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the variation of contact resistance such as gate contact resistance, source contact resistance and drain contact resistance. Although existing field-effect transistors and methods of forming field-effect transistors have been generally adequate for their intended purposes, they have not been entirely satisfactory in all respects.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
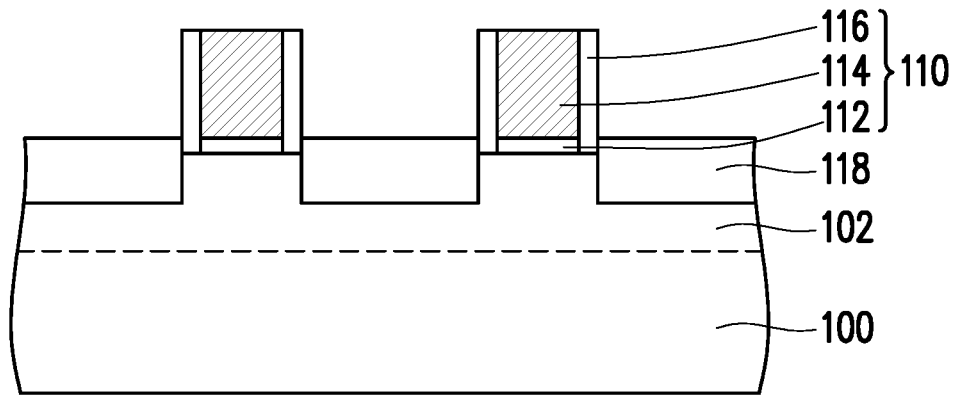
FIGS. 1A to 1F are cross-sectional views at various stages of forming a semiconductor device in accordance with some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 1F are cross-sectional views at various stages of forming a semiconductor device in accordance with some embodiments of the present disclosure. FIG. 2 illustrates a flow chart illustrating a method of forming a semiconductor device in accordance with some embodiments of the present disclosure. In some embodiments, the semiconductor device is a field effect transistor such as a fin field effect transistor (FinFET). The FinFET refers to any fin-based, multi-gate transistor. In alternative some embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC).

In addition, the semiconductor device of FIGS. 1A to 1F may be further processed using CMOS technology processing. Accordingly, it is understood that additional processes may be provided before, during, and after the method of FIG. 2, and that some other processes may only be briefly described herein. Also, FIGS. 1A to 1F are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

Figure 2:
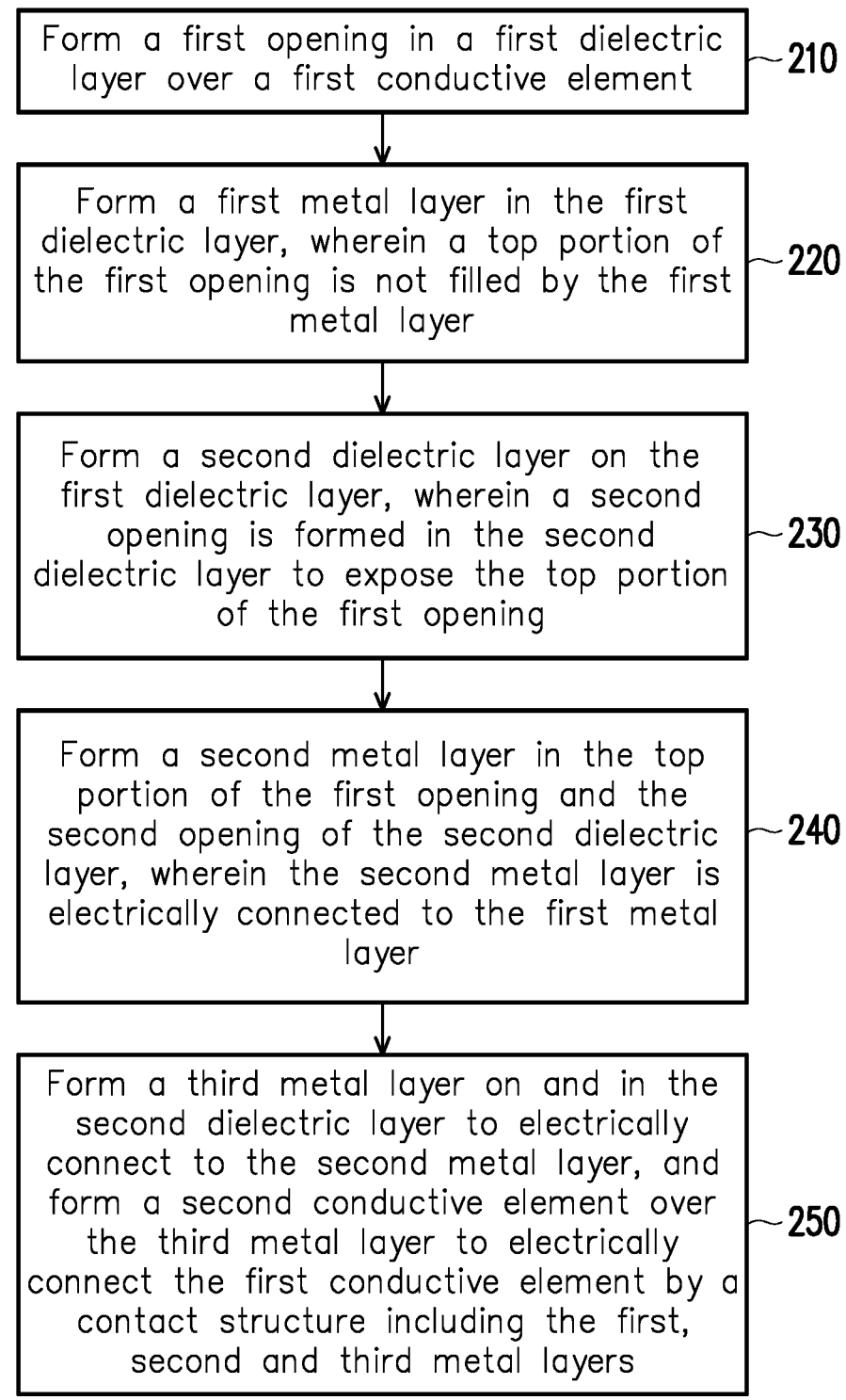
FIG. 2 illustrates a flow chart illustrating a method of forming a semiconductor device in accordance with some embodiments of the present disclosure.

Referring to FIG. 1A, a substrate 100 is provided. In some embodiments, the substrate 100 includes a crystalline silicon substrate (e.g., wafer). The substrate 100 may include various doped regions depending on design requirements (e.g., p-type substrate or n-type substrate). In some embodiments, the doped regions may be doped with p-type and/or n-type dopants. For example, the doped regions may be doped with p-type dopants such as boron or $BF_2$, n-type dopants such as phosphorus or arsenic and/or combinations thereof. The doped regions may be configured for an n-type FinFET, a p-type FinFET or the combination thereof. In alternative some embodiments, the substrate 100 may be made of some other suitable elemental semiconductor such as diamond or germanium, a suitable compound semiconductor such as gallium arsenide, silicon carbide, indium arsenide or indium phosphide, or a suitable alloy semiconductor such as silicon germanium carbide, gallium arsenic phosphide or gallium indium phosphide.

As shown in FIG. 1A, at least one fin structure 102 is formed on and/or in the substrate 100. In some embodiments, portions of the substrate 100 are removed to define the fin structure 102 protruding from the substrate 100. In some embodiments, the substrate 100 and the fin structure 102 are integrally formed, that is, there is no boundary between the substrate 100 and the fin structure 102. However, other techniques for fabricating the fin structure 102 are possible. In some embodiments, the substrate 100 and the fin structure 102 are made of a same material.

In some embodiments, an isolation structure (not shown) is formed between the fin structures 102, such as a local oxidation of silicon (LOCOS) or a shallow trench isolation (STI) structure. The isolation structure is configured to isolate the two fin structures 102. The isolation structure may be formed by filling a trench between the fin structures 102 with a dielectric material. In some embodiments, the dielectric material may include silicon oxide, silicon nitride, silicon oxynitride, fluoride-doped silicate glass (FSG), a spin-on dielectric material, a low-k dielectric material, any other suitable dielectric material or a combination thereof. The dielectric material may be formed by high-density-plasma chemical vapor deposition (HDP-CVD), sub-atmospheric CVD (SACVD) or by spin-on. In some embodiments, the isolation structure may have a multi-layer structure such as a thermal oxide liner layer filled with silicon nitride or silicon oxide.

In some embodiments, the fin structure 102 is an active region. In some alternative embodiments, the active regions may be formed in the substrate 100 and include various doping configurations depending on design requirements as known in the art. In some alternative embodiments, the active region may be doped with p-type or n-type dopants. For example, the active regions may be doped with p-type dopants such as boron or $BF_2$, n-type dopants such as phosphorus or arsenic and/or combinations thereof. The active regions may be configured for an N-type metal-oxide-semiconductor field effect transistor (referred to as an NMOSFET), or alternatively configured for a P-type metal-oxide-semiconductor field effect transistor (referred to as a PMOSFET).

A plurality of gate structures 110 are disposed on a portion of the fin structure 102 and cross over the fin structure 102, as shown in FIG. 2A. The gate structure 110 includes a gate dielectric layer 112, a gate electrode 114 and a spacer 116. The gate dielectric layer 112 is disposed between the substrate 100 and the gate electrode 114. The spacer 116 is formed adjacent to the gate electrode 114. The gate electrode 114 is single-layer structure or multi-layer structure. In some embodiments, the gate electrode 114 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some alternative embodiments, the gate electrode 114 may further include barrier layers, work function layers, liner layers, interface layers, seed layers, adhesion layers, etc. In some embodiments, a material of the spacer 116 may be $SiO_2$, SiN, SiON, SiCN or other suitable material. In some alternative embodiments, another spacer (not shown) is formed around the spacer 116 and has a material different from the spacer 116.

A source/drain region 118 is disposed in the fin structure 102 and/or the substrate 100 adjacent to the gate structure 110. In some embodiments, the source/drain region 118 is disposed adjacent to the two sides of the spacer 116, and a silicide (not shown) is selectively formed on the surface of the source/drain region 118. In some embodiments, the portions of the fin structure 102 are removed to form recesses using photolithography and etching processes. Then, the source-drain region 118 may be respectively epitaxially (epi) grown in the recesses. In some embodiments, the source-drain region 118 protrudes from the recesses and has an upper surface higher than an upper surface of the fin structure 102. In some embodiments, the sources and drain 118, such as silicon germanium (SiGe), is epitaxial-grown by a LPCVD process to form the source and drain of the p-type FinFET (or the PMOSFET). In alternative some embodiments, the source-drain region 118, such as silicon carbon (SiC), is epitaxial-grown by a LPCVD process to form the source and drain of the n-type FinFET (or the NMOSFET). In addition, although the source-drain region 118 is shaped as a rectangle, the disclosure is not limited thereto. In some alternative embodiment, the source-drain region 118 may be shaped as a diamond or other suitable shape.

Figure 1B:
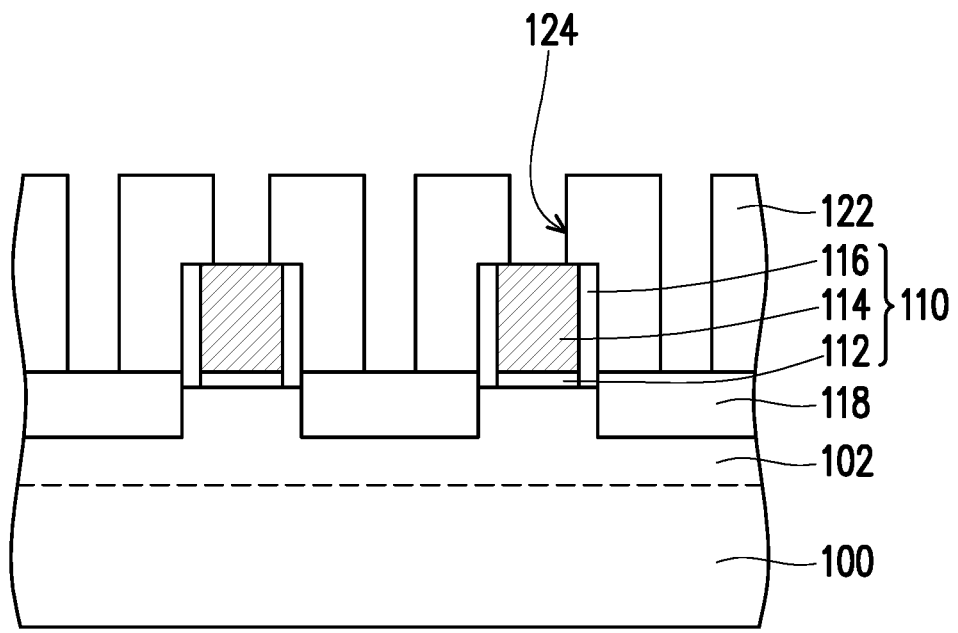

Referring to FIGS. 1B and 2, at step 210, at least one opening 124 is formed in a dielectric layer 122 over a conductive element such as the gate structures 110 and/or the source/drain region 118. In some embodiments, the dielectric layer 122 is formed over the substrate 100 to cover the gate structures 110 and the source/drain region 118, by a deposition process such as PVD or CVD or other suitable process. The dielectric layer 122 is single-layer structure or multi-layer structure. A material of the dielectric layer 122 may be $SiO_2$, SiN, SiON, SiCN, or other suitable material. Then, portions of the dielectric layer 122 are removed to form the openings 124 exposing portions of the gate structures 110 and the source/drain region 118 respectively. The portions of the dielectric layer 122 may be removed by an etching process such as dry etching process or wet etching process or other suitable process. In some alternative embodiments, a contact etch stop layer (CESL, not shown) is formed between the dielectric layer 122 the source/drain region 118 and the sidewall of the gate structure 110. Thus, the opening 124 over the source/drain region 118 may be further formed in the CESL. Furthermore, in some embodiments, the diameters of the openings 124 over the gate structures 110 and the source/drain regions 118 are equal, but the disclosure is not limited thereto. In other words, the diameters of the openings 124 over the gate structures 110 and the source/drain regions 118 may be different.

Figure 1C:
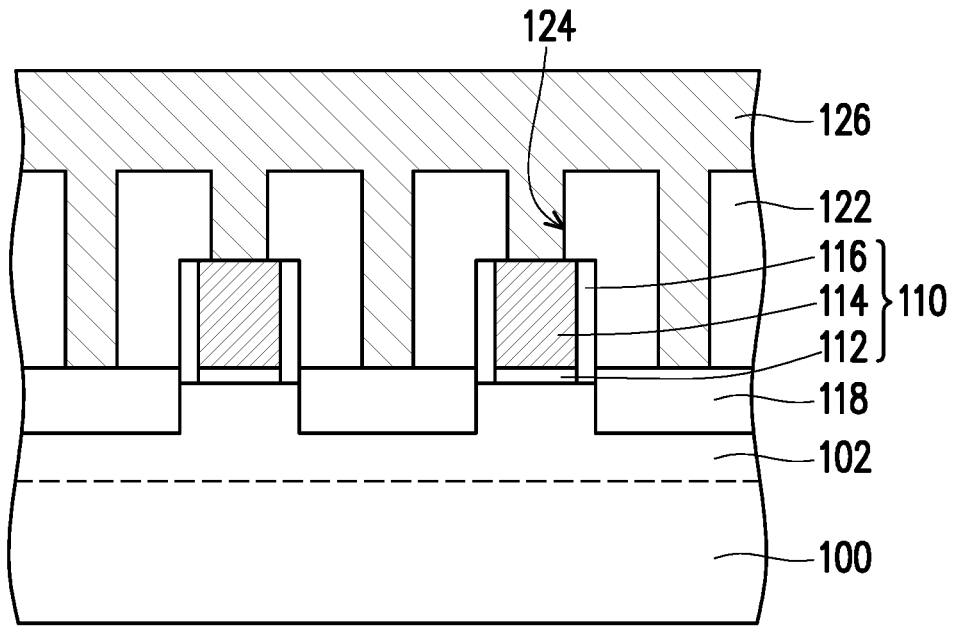
Figure 1D:
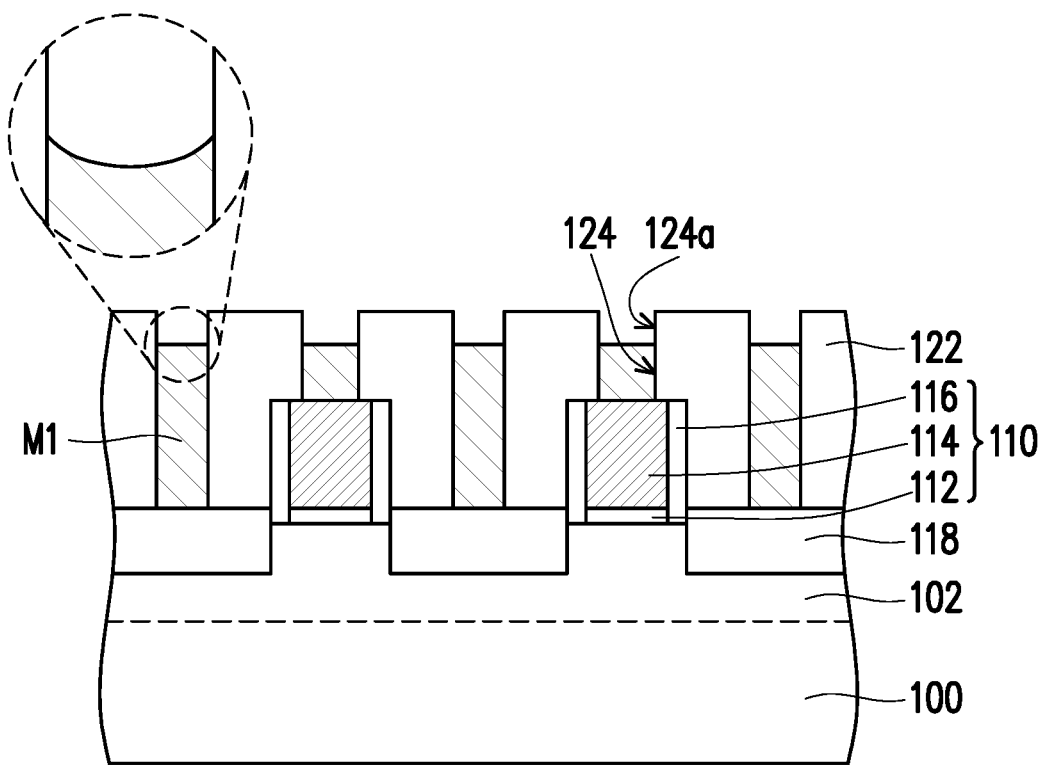

Referring to FIGS. 1C, 1D and 2, at step 220, a metal layer M1 is formed in the dielectric layer 122, wherein a top portion 124a of the opening 124 is not filled by the metal layer M1. In some embodiments, the metal layer M1 is in contact with and electrically connected to the conductive element such as the gate structures 110 and/or the source/drain region 118. In some embodiments, as shown in FIG. 1C, a metal material 126 is formed over the dielectric layer 122 to fill the opening 124. The metal material 126 may be cobalt (Co), tungsten (W), copper (Cu), titanium (Ti), tantalum (Ta), aluminum (Al), zirconium (Zr), hafnium (Hf), the like, or other suitable metal. In some embodiments, the metal material 126 may be cobalt, tungsten or copper. In some embodiments, the metal material 126 may be formed by using sputtering, PVD, CVD, atomic layer deposition (ALD), any other suitable formation technique or a combination thereof.

Then, as shown in FIG. 1D, portions of the metal material 126 outside the opening 124 and in the top portion 124a of the opening 124 are removed, so as to form the metal layer M1 and expose the top portion 124a of the opening 124 on the metal layer M1. In some embodiments, the portions of the metal material 126 outside the opening 124 and in the top portion 124a of the opening 124 are simultaneously removed by a planarization process such a chemical mechanical polish (CMP) process. During the CMP process, the portion of the metal material 126 outside the opening 124 is first removed by using a top surface of the dielectric layer 122 as a stop layer. Accordingly, a top surface of the metal material 126 is substantially flush with the top surface of the dielectric layer 122. Then, the CMP process is continuously performed, and thus the portion of the metal material 126 in the top portion 124a of the opening 124 is further removed while the top surface of the dielectric layer 122 is intact. In other words, by increasing the process time for the CMP process, the top portion of the metal material 126 in the opening 124 can be easily removed without additional process. Furthermore, the top portion of the metal material 126 in the opening 124 can be also removed by adjusting the composition of the slurry for the CMP process. In some alternative embodiments, the portion of the metal material 126 in the top portion 124a of the opening 124 may be removed by an additional etching process after removing the metal material 126 outside the opening 124.

In some embodiments, the metal layer M1 is disposed in a portion of the opening 124, that is, the opening 124 is not filled by the metal layer M1. The removed amount of the metal material 126 can be depended on the critical dimension performance such as difference between a measured top critical dimension (TCD) and a predetermined top critical dimension, a difference between a measured bottom critical dimension (BCD) and a predetermined bottom critical dimension and so on. In some embodiments, the removed amount of the metal material 126 to the entire metal material 126 in the opening 124 is less than 30%, that is, the metal layer M1 has a thickness not less than 70% of a total depth of the opening 124. However, the disclosure is not limited thereto. In some embodiments, the top surface of the metal layer M1 has a dish-like depression since the portion of the metal material 126 in the top portion 124a of the opening 124 is removed by the CMP process, but the disclosure is not limited thereto. In some alternative embodiment, the metal layer M1 may have a substantially flat surface. Additionally, in some embodiments, the top surfaces of the metal layers M1 over the gate structures 110 and the source/drain regions 118 are at the same level, but the disclosure is not limited thereto. In other words, the removed amount of the metal material 126 over the gate structures 110 and the source/drain regions 118 may be different. In some alternative embodiments, after removing the portion of the metal material 126 outside the opening 124 and/or the portion of the metal material 126 in the top portion 124a of the opening 124, at least one of portions of the metal material 126 over the gate structures 110 and the source/drain regions 118 may be further removed. Thus, the top surfaces of the metal layers M1 over the gate structures 110 and the source/drain regions 118 are not at the same level.

Figure 1E:
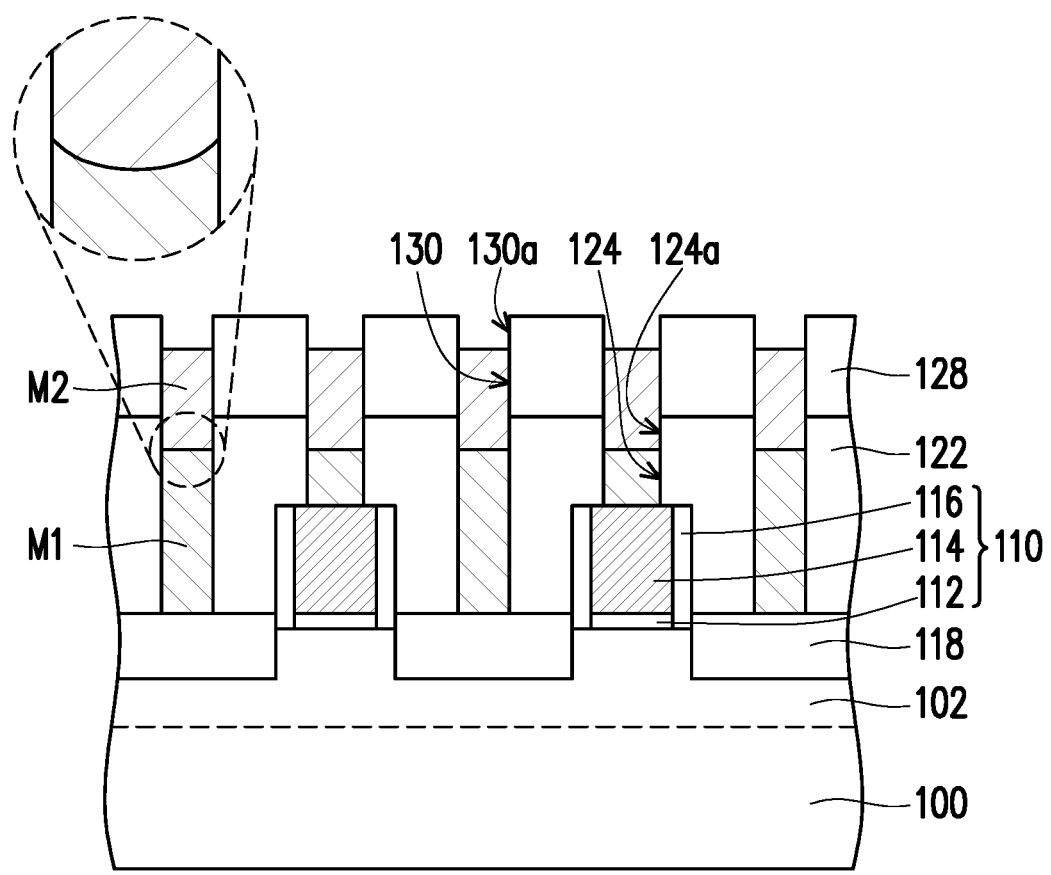

Referring to FIGS. 1E and 2, at step 230, a dielectric layer 128 is formed on the dielectric layer 122, and an opening 130 is formed in the dielectric layer 128 to expose the top portion 124a of the opening 124. In some embodiments, the dielectric layer 128 is in contact with the dielectric layer 122, for example. In some embodiments, a material of the dielectric layer 128 may be different from or the same of the dielectric layer 122. In some embodiments, a BCD of the opening 130 may be substantially equal to the TCD of the opening 124, and a sidewall of the opening 130 is substantially aligned with a sidewall of the opening 124, but the disclosure is not limited thereto. In some alternative embodiments, the BCD of the opening 130 may be different from the TCD of the opening 124. For example, the BCD of the opening 130 may be larger than the TCD of the opening 124, and thus the opening 130 and the opening 124 are partially overlapped.

Then, at step 240, a metal layer M2 is formed in the top portion 124a of the opening 124 in the dielectric layer 122 and the opening 130 of the dielectric layer 128, and the metal layer M2 is electrically connected to the metal layer M1. In some embodiments, the metal layer M2 is disposed in the dielectric layer 128 and further extended into the dielectric layer 122. Similarly, the metal layer M2 is formed in a portion of the opening 130, and a top portion 130a of the opening 130 is not filled by the metal layer M2. In some embodiments, the metal layer M2 is in contact with and electrically connected to the metal layer M1. The interface of the metal layers M1 and M2 is lower than the interface of the dielectric layers 122 and 128. In some embodiments, a portion of the metal layer M2 in the opening 124 has a thickness less than 30% of a total depth of the opening 124, for example. The metal layer M2 has a resistance different from the metal layer M1. In some embodiments, the metal layer M2 has a metal different from the metal layer M1. The metal layer M2 may be cobalt, tungsten, copper, titanium, tantalum, aluminum, zirconium, hafnium, the like, or other suitable metal. In some embodiments, the metal layer M2 may be cobalt, tungsten or copper. In an embodiment, the metal layer M1 is cobalt, and the metal layer M2 is tungsten, for example. In some embodiment, the forming method of the dielectric layer 128, the opening 130 and the metal layer M2 are similar to those of the dielectric layer 122, the opening 124 and the metal layer M1, and thus the details are omitted herein.

Figure 1F:
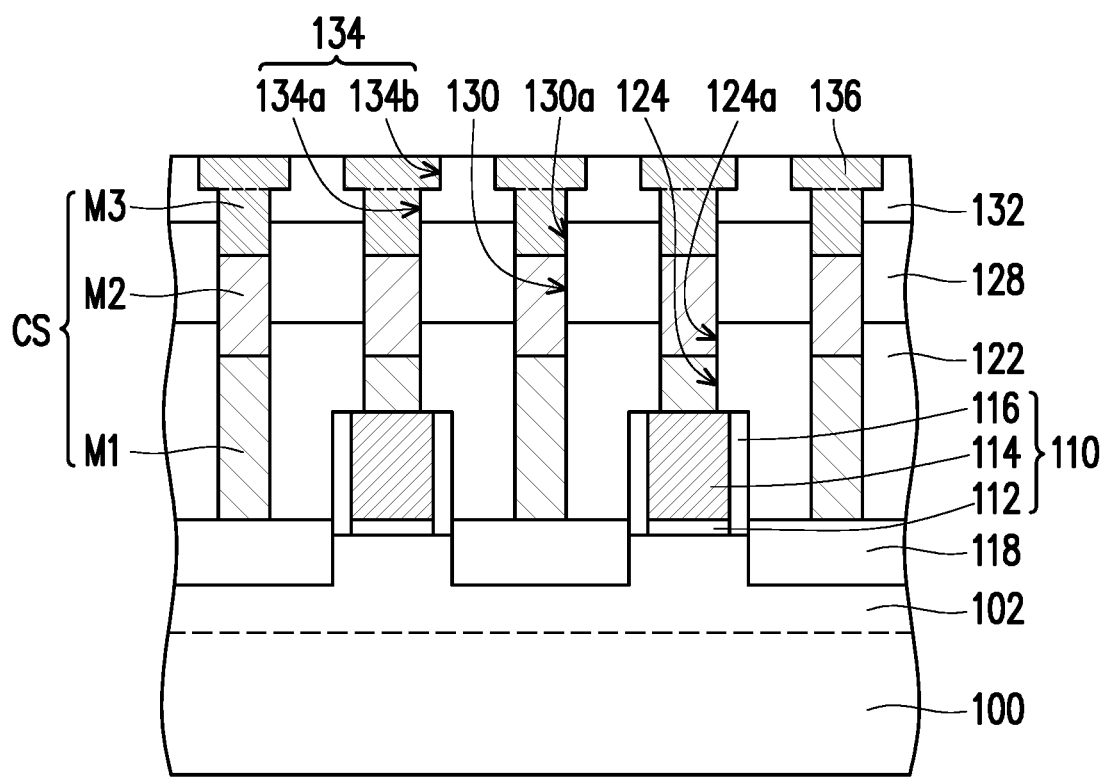

Referring to FIGS. 1F and 2, at step 250, a metal layer M3 is formed in a dielectric layer 132 on the dielectric layer 128 and extended into the dielectric layer 128. Then, a conductive element 136 is formed over the metal layer M3, wherein the conductive element 136 and the conductive element such as the gate structures 110 and/or the source/drain region 118 are electrically connected by a contact structure CS including the metal layers M1, M2 and M3 in the dielectric layers 122, 128 and 132. In some embodiments, the dielectric layer 132 is formed on the dielectric layer 128, and an opening 134 is formed in the dielectric layer 132 to expose the top portion 130a of the opening 130. In some embodiments, the opening 134 includes an opening 134a such as a via opening and a trench 134b on the opening 134a, and the trench 134b has a diameter larger than that of the opening 134a. The BCD of the opening 134a may be substantially equal to the TCD of the opening 130, and a sidewall of the opening 134a is substantially aligned with a sidewall of the opening 130, but the disclosure is not limited thereto. In some alternative embodiments, the BCD of the opening 134a may be different from the TCD of the opening 130.

Then, a metal material (not shown) is formed over the dielectric layer 132 to fill the top portion 130*a* of the opening 130 and the opening 134, and then a portion of the metal material outside the opening 134 is removed. In some embodiments, the portion of the metal material outside the opening 130 is removed by a planarization process such a CMP process or an etching process such as a dry etching process or a wet etching process. In some embodiments, the portion of the metal material is removed by using a top surface of the dielectric layer 132 as a stop layer, and thus a top surface of the metal material is substantially flush with the top surface of the dielectric layer 132. After that, the metal layer M3 is formed in the top portion 130*a* of the opening 130 and the opening 134*a*, and the conductive element 136 is formed in the trench 134*b*. In some embodiments, the metal layer M3 has a resistance different from the metal layer M2. In some embodiments, the metal layer M3 has a metal different from the metal layer M2. The metal layer M3 may be cobalt, tungsten, copper, titanium, tantalum, aluminum, zirconium, hafnium, the like, or other suitable metal. In some embodiments, the metal layer M3 may be cobalt, tungsten or copper. In an embodiment, the metal layer M2 is tungsten, and the metal layer M3 is copper, for example. In some embodiments, the conductive element 136 is a metal line or other suitable conductive element. In some embodiments, the metal layer M3 and the conductive element 136 are formed simultaneously by a dual-damascene process, for example, but the disclosure is not limited thereto. In some alternative embodiments, the metal layer M3 and the conductive element 136 may be formed separately. It should be noted that even though the contact structure CS including three metal layers M1, M2 and M3 are disclosed in this embodiment, the quantity of the metal layers is not limited to three, but could by any quantity depending on the demand of the product. In some alternative embodiments, the contact structure CS may include two metal layers or more than three metal layers. Moreover, in some alternative embodiments, the metal layers M1 of the contact structures CS may be formed separately and at different heights. Similarly, the metal layers M2 or the metal layers M3 may be formed separately and at different heights.

Figure 3:
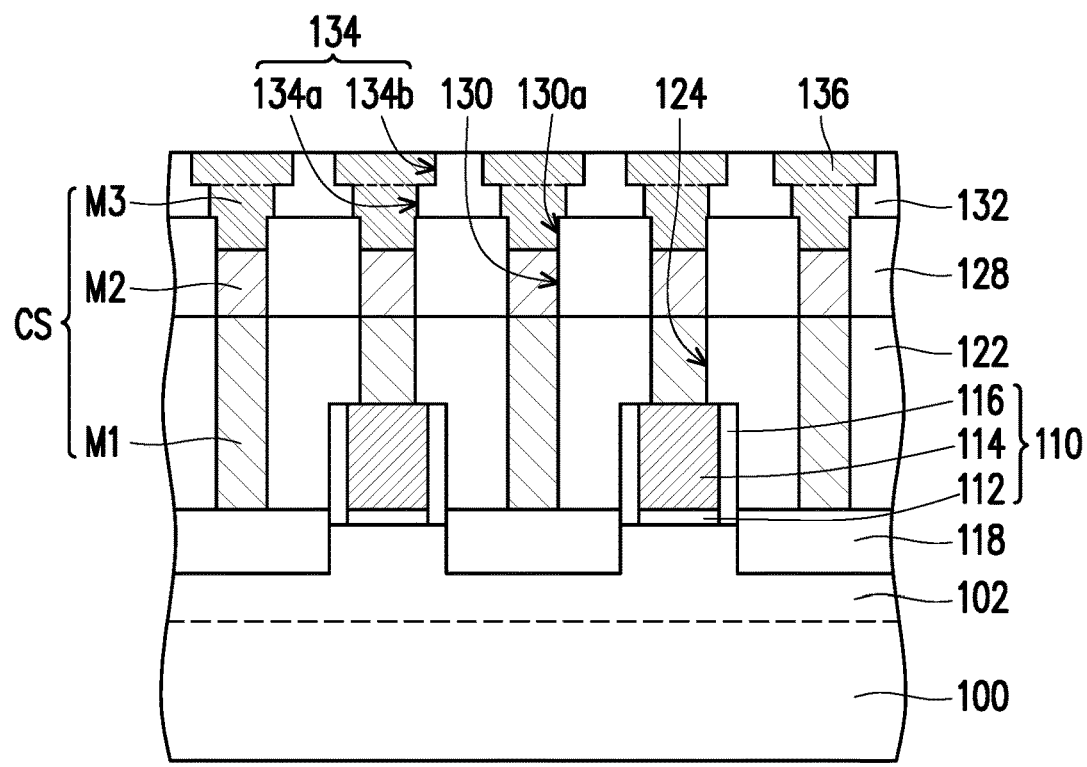
FIG. 3 is a cross-sectional view of a semiconductor device in accordance with some embodiments of the present disclosure.

Furthermore, in some embodiments, the metal layer M2 is extended into the dielectric layer 122, and the metal layer M3 is extended into the dielectric layer 128, but the disclosure is not limited thereto. In some alternative embodiments, there may be only one metal layer of the contact structure is simultaneously disposed in two continuous stacking dielectric layer, that is, there may be only one interface of the metal layers lower than an interface of the corresponding dielectric layers. For example, as shown in FIG. 3, in one contact structure CS, the interface of the metal layers M2 and M3 is lower than the interface of the dielectric layers 128 and 132, but the interface of the metal layers M1 and M2 is substantially at the same level of the interface of the dielectric layers 122 and 128. In other words, the metal layer M2 is not extended into the dielectric layer 122. Additionally, in the contact structure CS of FIG. 1F, the diameters of the metal layers M1, M2 and M3 are the same, but the disclosure is not limited thereto. For example, in FIG. 3, a diameter of the metal layer M3 in the dielectric layer 132 is different from a diameter of the metal layer M2, and thus the metal layer M3 and the metal layer M2 are partially overlapped.

Figure 4:
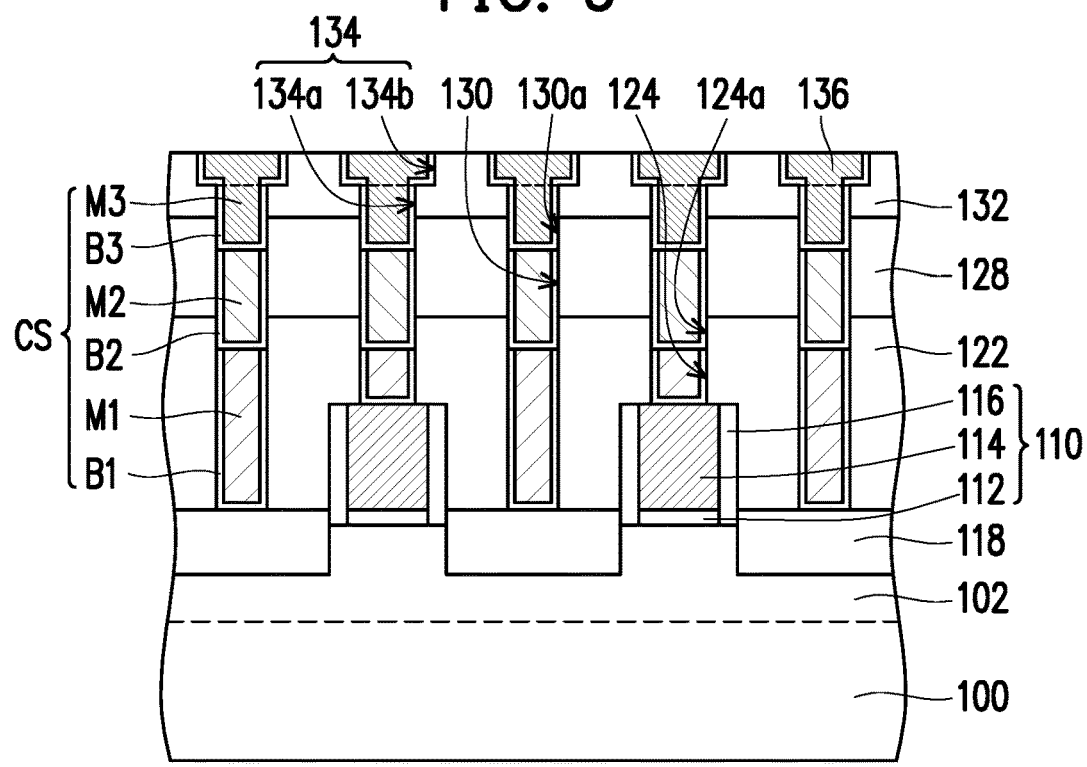
FIG. 4 is a cross-sectional view of a semiconductor device in accordance with some embodiments of the present disclosure.

FIG. 4 is a schematic cross sectional view illustrating a semiconductor device in accordance with some embodiments of the present disclosure. In FIG. 4, a semiconductor device similar to the structure as shown in FIG. 1F is described, except barrier layers are formed aside the metal layers. Referring to FIG. 4, a contact structure CS includes metal layers M1-M3 and barrier layers B1-B3 aside the metal layers M1-M3, and at least one barrier layer B2, B3 is formed between the metal layers M1-M3. The barrier layer B2, B3 is disposed at an interface of the metal layers M1-M3, which is lower than an interface of dielectric layers 122, 128 and 132. In some embodiments, the barrier layer B1, B2 is formed at entire interface of the metal layers M1-M3. In some embodiments, the barrier layer B1 is disposed on a sidewall of a bottom portion of an opening 124, and the metal layer M1 is formed in the bottom portion of the opening 124. In other words, the opening 124 is partially filled by the metal layer M1 and the barrier layer B1 aside the metal layer M1, and a top portion 124*a* of the opening 124 is not filled. In some embodiments, the top surfaces of the barrier layer B1 and the metal layer M1 are substantially coplanar. The barrier layer B2 is disposed on sidewalls of the top portion 124*a* of the opening 124 and a bottom portion of an opening 130 and a top surface of the metal layer M1, and the metal layer M2 is formed in the top portion 124*a* of the opening 124 and the bottom portion of the opening 130. The barrier layer B3 is disposed on sidewalls of a top portion 130*a* of the opening 130 and an opening 134*a* and a trench 134*b* of an opening 134 and a top surface of the metal layer M2, and the metal layer M3 is formed in the opening 134*a*, and a conductive element 136 is formed in the trench 134*b*.

The barrier layers B1-B3 and the metal layers M1-M3 are formed by the following steps. In some embodiments, a material of the barrier layer B1 is formed on the sidewall of the opening 124, and a material of the metal layer M1 is formed to fill the opening 124, and then the materials of the barrier layer B1 and the metal layer M1 outside the opening 124 and in the top portion 124*a* of the opening 124 are removed, so as to expose the top portion 124*a* of the opening 124. Then, a material of the barrier layer B2 is formed on sidewalls of the top portion 124*a* of the opening 124 and the opening 130 and the top surface of the metal layer M1, and a material of the metal layer M2 is formed to fill the top portion 124*a* of the opening 124 and the opening 130, and then the materials of the barrier layer B2 and the metal layer M2 outside the opening 130 and in the top portion 130*a* of the opening 130 are removed, so as to expose the top portion 130*a* of the opening 130. Next, a material of the barrier layer B3 is formed on sidewalls of the top portion 130*a* of the opening 130 and the opening 134 and the top surface of the metal layer M2, and a material of the metal layer M3 and the conductive element 136 is formed to fill the top portion 130*a* of the opening 130 and the opening 134, and then the materials outside the opening 134 are removed.

In some embodiments, the contact structure includes at least two metal layers stacked sequentially, and at least one metal layer in a dielectric layer is extended into another dielectric layer to electrically connect another metal layer. The metal layers have resistance different from one another, and thus the total resistance of the contact structure can be adjusted by controlling the ratio of the metal layers according to the requirements. In addition, the ratio of the metal layers in the contact may be determined by critical dimension performance in time, and thus the contact structure may have desired and stable resistance. Accordingly, the variation of contact resistance such as gate contact resistance, source contact resistance and drain contact resistance due to scaling down of the semiconductor device is compensated.

In accordance with some embodiments of the disclosure, a contact structure includes a first metal layer and a second metal layer. The first metal layer is disposed in a first dielectric layer. The second metal layer is disposed in a second dielectric layer and extended into the first dielectric layer to electrically connect the first metal layer, wherein the first metal layer and the second metal layer include different metals.

In accordance with alternative embodiments of the disclosure, a semiconductor device includes a first conductive element, a second conductive element and a contact structure. The contact structure is disposed between and electrically connects the first and second conductive elements. The contact structure includes a first metal layer in a first dielectric layer and a second metal layer partially in the first dielectric layer and partially in a second dielectric layer on the first dielectric layer, wherein resistance of the first metal layer is different form resistance of the second metal layer.

In accordance with yet alternative embodiments of the disclosure, a method of forming a semiconductor device includes the following steps. A first opening is formed in a first dielectric layer over a first conductive element. A first metal layer is formed in the first dielectric layer, wherein a top portion of the first opening is not filled by the first metal layer. A second dielectric layer is formed on the first dielectric layer, wherein the second dielectric layer has a second opening to expose the top portion of the first opening. A second metal layer is formed in the second opening and the top portion of the first opening. A second conductive element is formed over the second metal layer, wherein the first and second conductive elements are electrically connected by a contact structure including the first metal layer and the second metal layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A contact structure, comprising:
a first metal layer, disposed in a first dielectric layer; and
a second metal layer, partly penetrating into a second dielectric layer without penetrating the entire second dielectric layer and extended into the first dielectric layer to electrically connect the first metal layer, wherein the first metal layer and the second metal layer comprise different metals.

2. The contact structure of claim 1, wherein an interface of the first metal layer and the second metal layer has a dish-like depression.

3. The contact structure of claim 1, wherein the first metal layer is in contact with the second metal layer.

4. The contact structure of claim 1, wherein resistance of the first metal layer is different from resistance of the second metal layer.

5. The contact structure of claim 1, wherein the metals of the first metal layer and the second metal layer are respectively selected from a group consisting of tungsten, copper and cobalt.

6. The contact structure of claim 1 further comprising a barrier layer disposed between the first metal layer and the second metal layer and surrounding an entire sidewall of the second metal layer.

7. A semiconductor device, comprising:
a first conductive element;
a second conductive element; and
a contact structure disposed between and electrically connecting the first and second conductive elements, the contact structure comprising:
a first conductive structure in a first dielectric layer; and
a second conductive structure not integrally formed with the first conductive structure, partially in the first dielectric layer and partially in a second dielectric layer on the first dielectric layer, wherein an entire sidewall of the second conductive structure is substantially aligned with and in contact with an entire sidewall of the first conductive structure.

8. The semiconductor device of claim 7, wherein metals of the first and second conductive structures are respectively selected from a group consisting of tungsten, copper and cobalt.

9. The semiconductor device of claim 7, wherein the first conductive element comprises a gate structure or a source/drain region.

10. The semiconductor device of claim 7 further comprising a third conductive structure in a third dielectric layer over the first dielectric layer and the second dielectric layer, wherein the third conductive structure is further extended into the second dielectric layer to electrically connect the second conductive structure.

11. The semiconductor device of claim 7, wherein the second conductive structure comprises a metal layer and a barrier layer disposed between the metal layer and the first conductive structure and surrounding the entire sidewall of the metal layer.

12. A contact structure, comprising:
a first conductive structure disposed in a first dielectric layer; and
a second conductive structure not integrally formed with the first conductive structure, partly penetrating into a second dielectric layer without penetrating the entire second dielectric layer and extended into the first dielectric layer, wherein the first conductive structure comprises a first metal and the second conductive structure comprises a second metal, and the first metal is in contact with the second metal.

13. The contact structure of claim 12, wherein an interface between the first and second conductive structures is flat.

14. The contact structure of claim 12, wherein an interface between the first and second conductive structures has a dish-like depression.

15. The contact structure of claim 12, wherein a diameter of the second conductive structure is substantially constant and substantially equal to a diameter of the first conductive structure.

16. The contact structure of claim 1, wherein an entire sidewall of the second metal layer is substantially aligned with an entire sidewall of the first metal layer.

17. The contact structure of claim 1, wherein a diameter of the second metal layer is substantially constant and substantially equal to a diameter of the first metal layer.

18. The contact structure of claim 7, wherein the entire sidewall of the second conductive structure is substantially vertically aligned with the entire sidewall of the first conductive structure.

19. The contact structure of claim 10, wherein a top surface of the third conductive structure is substantially flush with a top surface of the third dielectric layer.

20. The contact structure of claim 12, wherein the second conductive structure is not extended onto a top surface of the first dielectric layer.

* * * * *